(12) United States Patent
Jaklin et al.

(10) Patent No.: US 7,045,712 B2
(45) Date of Patent: May 16, 2006

(54) METHOD OF PRODUCING AN ELECTRONIC DEVICE AND ELECTRONIC DEVICE

(75) Inventors: Ralf Jaklin, Liederbach (DE); Werner Wallrafen, Hofheim (DE)

(73) Assignee: Siemens Aktiengesellschaft, München (DE)

( * ) Notice: Subject to any disclaimer, the term of this patent is extended or adjusted under 35 U.S.C. 154(b) by 140 days.

(21) Appl. No.: 10/400,194

(22) Filed: Mar. 26, 2003

(65) Prior Publication Data
US 2003/0223205 A1 Dec. 4, 2003

(30) Foreign Application Priority Data
Mar. 28, 2002 (DE) .................. 102 14 308
Feb. 10, 2003 (DE) .................. 103 05 364

(51) Int. Cl.
*H01L 23/28* (2006.01)
(52) U.S. Cl. .................. 174/52.2
(58) Field of Classification Search ........ 174/52.2, 174/52.4
See application file for complete search history.

(56) References Cited

U.S. PATENT DOCUMENTS 6,665,192 B1 * 12/2003 Wimberger Friedl et al. .... 361/752

* cited by examiner

*Primary Examiner*—Hung V. Ngo
(74) *Attorney, Agent, or Firm*—Martin A. Farber

(57) ABSTRACT

A method of producing an electronic device, with a stamped sheet-metal part loaded with electronic components being encapsulated in a thermoplastic, insulating material to provide protection against environmental influences, and also an electronic device comprising electronic components arranged on a stamped sheet-metal part and electrically connected to one another by the part, the stamped sheet-metal part and the electronic components being encapsulated in the thermoplastic, insulating material by the injection-molding process. Providing a device with which protection of the electronic components during encapsulation is ensured, the stamped sheet-metal part (2) has at least one region (3) similar to a protective shield, under which the electronic components are arranged, and the electronic components (4) are arranged downstream of the stamped sheet-metal part (2) in the direction of injection pressure (9) of the heated, thermoplastic, insulating material (5)

18 Claims, 5 Drawing Sheets

METHOD OF PRODUCING AN ELECTRONIC DEVICE AND ELECTRONIC DEVICE

FIELD AND BACKGROUND OF THE INVENTION

The invention relates to a method of producing an electronic device, with a stamped sheet-metal part loaded with electronic components being encapsulated in a thermoplastic, insulating material to provide protection from environmental influences, and to an electronic device comprising electronic components arranged on a stamped sheet-metal part and electrically connected to one another by said part, the stamped sheet-metal part and the electronic components being encapsulated in a thermoplastic, insulating material by the injection-molding process.

To provide protection from environmental influences, electronic circuits are usually completely sheathed in plastic. A method of encapsulating electronic circuits in insulating material is known from German laid-open patent application DE 44 36 523 A1. Here, before being loaded with electronic components, a conductor part is encapsulated in an electrically insulating material in such a way that clearances remain in the encapsulation on the conductor part for positioning and connecting the electronic components. Subsequently, the loading with electronic components and their welding take place. After that, the partly encapsulated conductor part is placed into an injection mold for encapsulating in the material forming a housing of an electronic device.

An electronic device produced in this way is used for example as a sensor operated in a motor vehicle. Sensors used in motor vehicles are exposed to very adverse environmental conditions. ABS sensors, for example, must endure heavy soiling, withstand considerable temperature fluctuations, at the same time operate extremely reliably and be very durable. This can only be ensured if the sensor and the electronics required in its direct vicinity are sheathed in at least one high-grade protective layer.

It has proven to be inexpensive and advantageous from a process engineering aspect to mount the sensor and the electronics required in its direct vicinity completely on a stamped sheet-metal part. The metallic stamped sheet-metal part is in this case used both for the electrical contacting of the electronic components and for the mechanical fixing of the components in the desired position. The electronic components are mechanically and electrically connected to the stamped sheet-metal part by soldering or welding. The subassembly prepared in this way is inserted into a prefabricated lower housing part and then placed into an injection mold for producing the upper housing half. The upper housing half is produced by injection-molding with the electrically insulating material.

During the encapsulation of the electronic components, a very high injection pressure is transferred to them and they are subjected to a very high temperature, which is passed on to the components from the insulating material injected in a heated state, which can lead to individual electronic components being damaged or destroyed, making the entire subassembly worthless.

The invention is therefore based on the object of providing a method and a device with which protection of the electronic components during encapsulation is ensured.

SUMMARY OF THE INVENTION

The object is achieved according to the invention by the heated, thermoplastic, insulating material being injected in such a way that it initially reaches the stamped sheet-metal part, whereby a significant part of its thermal and kinetic energy is deposited there, and it subsequently flows around the electronic components.

This method has the advantage that the insulating material injected in a heated state transfers most of its kinetic and thermal energy to the robust stamped sheet-metal part, without the sensitive electronic components being directly affected, thereby eliminating the possibility of them being damaged during the encapsulating operation.

With regard to the electronic device, the object is achieved by the stamped sheet-metal part having at least one region similar to a protective shield, under which the electronic components are arranged, and by the electronic components being arranged downstream of the stamped sheet-metal part in the direction of injection pressure of the heated, thermoplastic, insulating material.

The invention has the advantage that the stamped sheet-metal part necessary in any case for the electrical contacting and mechanical fixing of the electronic components, which is also referred to as a leadframe, also ensures protection for the electronic components from the production-related stresses if it is designed and arranged in the way according to the invention.

In the case of an advantageous configuration, at least one mechanical reinforcement is impressed onto the at least one region similar to a protective shield. By impressing with a mechanical structure, increased mechanical strength is accomplished in an inexpensive and uncomplicated way, which results in better resistance of the regions similar to a protective shield to the mechanical stresses during the molding-on of the thermoplastic material. The impressed structures may, for example, have the form of a double cross, a dome or a cloverleaf. Moreover, the form of the impressed structure may advantageously be adapted to the form of the electronic component covered by it.

As an alternative to this, the mechanical reinforcement is adhesively bonded, welded or soldered onto the at least one region similar to a protective shield. This has the advantage that the mechanical reinforcement connected to the region similar to a protective shield makes the protective shield able to withstand particularly high mechanical stresses.

In a development, the stamped sheet-metal part is connected to the electronic components in such a way that very little thermal energy is transferred to the electronic components from the heated stamped sheet-metal part. As a result, it is ensured that most of the thermal energy transferred from the injected material is absorbed by the insensitive stamped sheet-metal part and that the electronic components are largely protected from the thermal stress.

In a further configuration, the at least one region of the stamped sheet-metal part similar to a protective shield is formed in a way similar to a surface area and this surface area is arranged opposite at least one electronic component. With the protective shield shaped in a way similar to a surface area, the electronic components arranged behind it can be protected particularly well from the energy of the injected thermoplastic material.

In the case of a next configuration, the electronic components to be protected are arranged between the stamped sheet-metal part and a lower housing part. The lower housing part in this case performs the function of a collecting vessel for the injected thermoplastic, insulating material. At the same time, the lower housing part serves as a termination of the electronic device with respect to the surroundings which is mechanically robust and resistant to environmental influences. In addition, the lower housing part may have means for joining the electronic device to the components carrying the device.

In the case of a development, at least one chamber-like formation is formed in the lower housing part. The sensor, a capacitor, a resistor or some other electronic component may be introduced into the chamber-like formation, for example, before the electronic device is encapsulated. The chamber-like formation has the effect of creating a small, defined volume, which is filled with the thermoplastic, insulating material.

In addition, it is conceivable for the lower housing part to have at least one channel, which permits the specific filling of the chamber-like formation in the lower housing part and/or of the entire lower housing part with thermoplastic, insulating material. This makes it possible to protect the sensitive electronic component located in the chamber-like formation from the high thermal and kinetic energy of the thermoplastic material and nevertheless to surround it partly or completely with the insulating material.

It is advantageous if the regions similar to a protective shield have at least one aperture, which permits specific filling of the chamber-like formation in the lower housing part and/or of the entire lower housing part with thermoplastic, insulating material. The aperture is in this case located in the region similar to a protective shield in such a way that all the component parts of the electronic device are optimally enclosed by the thermoplastic material, without the high energy entrained by the thermoplastic material leading to the sensitive electronic components being destroyed.

In the case of one configuration, an elastic, vibration-damping material comes at least partly into contact with the electronic components (4) to be protected. Apart from the electrical insulation of the electronic components and the protection of the components from environmental influences, it is very advantageous also to protect the components from unwanted vibrations. For this purpose, an elastic, vibration-damping material can be introduced into the lower housing part without or in addition to the thermoplastic, insulating material. Of course, a single injected material may combine all the stated properties in itself.

In the case of a next configuration, the terminal conductors of the electronic components are welded, adhesively bonded or soldered to the stamped sheet-metal part. Welding or soldering are simple and inexpensive methods for the electrical and mechanical connection of electronic components to metal parts which can easily be used on an industrial scale.

At the same time, the terminal conductors of the electronic components may be bent in an S-shaped manner, whereby the components on the one hand immediately assume their desired position after joining to the stamped sheet-metal part and on the other hand are easier to handle when joining them on.

Apart from that, the terminal conductors of the electronic components can be bent in such a way that the electronic components are at a desired angle in relation to the stamped sheet-metal part. For some sensors, for example, it is important that they are arranged at a predetermined angle to a component which generates a signal in the sensor. If the terminal conductors are bent in an advantageous way from the outset, there is no need for subsequent working of the electronic components connected to the stamped sheet-metal part.

In the case of a next advantageous development, the stamped sheet-metal part has connecting elements for contacting other electronic devices. As a result, there is no need for the subsequent mounting of a connector. It is particularly advantageous if the connecting elements are designed as flat contacts, since flat contacts ensure a particularly good and secure electrical contact with respect to the next electronic device.

BRIEF DESCRIPTION OF THE DRAWINGS

The invention allows for numerous embodiments. One of these is to be explained on the basis of the figures represented in the drawings, in which.

DETAIL DESCRIPTION OF THE PREFERRED EMBODIMENT

Figure 1:
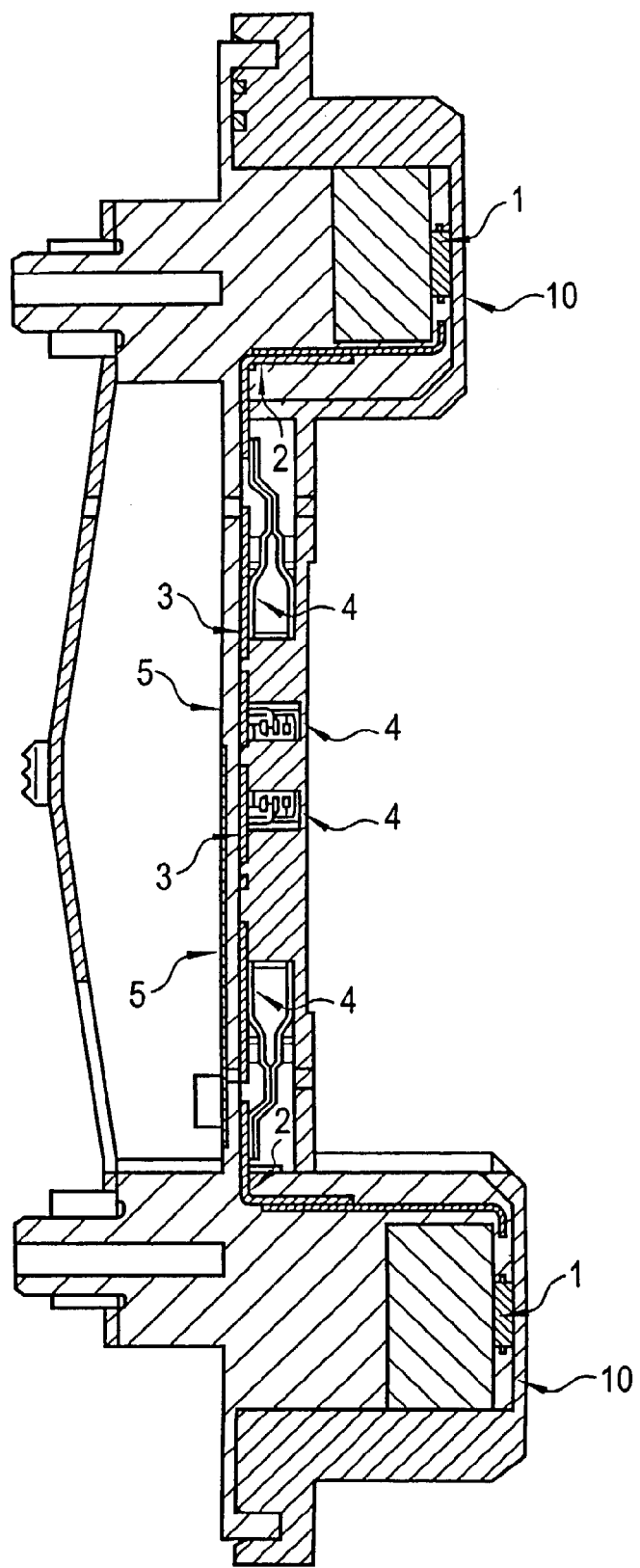
FIG. 1 shows a sectional representation of a sensor system with two sensor heads and the stamped sheet-metal part according to the invention.

FIG. 1 shows a sensor system with two Hall-effect sensors 1, a stamped sheet-metal part 2, regions 3 similar to a protective shield of the stamped sheet-metal part 2 and electronic components 4, which are connected to the stamped sheet-metal part 2. To provide protection from environmental influences, the sensor heads 1 are provided with a covering lower housing part 10. With the aid of the stamped sheet-metal part 2, the Hall-effect sensors 1 are electrically connected to the electronic components 4. Arranged on the stamped sheet-metal part 2 are all the electronic components 4 which have to be placed in the direct vicinity of the Hall-effect sensors 1, such as, for example, interference-suppression capacitors or pre-amplifiers. The stamped sheet-metal part 2 is formed as a self-supporting, metallic structure, which is both used as a conductor track 7 and also required for the mechanical fixing of the electronic components 4. The electronic components 4 are connected to the stamped sheet-metal part 2 by soldering or welding. The stamped sheet-metal part 2 has regions 3 similar to a protective shield, in the protective area of which the electronic components 4 are placed.

The production of the electronic device takes place in that, to provide protection for the electronic components 4 and the conductor track structure 7 from environmental influences, the stamped sheet-metal part 2 loaded with electronic components 4 is placed into the lower housing part 10 and then encapsulated in the thermoplastic material, thereby producing a hermetic termination against environmental influences.

The thermoplastic material 5 is injected under relatively high pressure and at high temperature directly onto the stamped sheet-metal part 2. Since the electronic components 4 are placed in the lower housing part 10 such that they are on the side of the stamped sheet-metal part 2 facing the lower housing part 10, the covering according to the invention of the electronic components 4 by the regions 3 similar to a protective shield of the stamped sheet-metal part 2 durably prevents the electronic components 4 from being damaged.

The thermoplastic material 5 initially reaches the stamped sheet-metal part 2, where it deposits its kinetic energy. The structure of the stamped sheet-metal part 2 is mechanically stable enough to withstand the stresses. A large part of the thermal energy entrained by the thermoplastic material 5 is also absorbed by the stamped sheet-metal part 2 and, consequently, an effective protection is ensured for the electronic components 4 from pressure-induced and thermal destruction during the plastic encapsulation.

Figure 2:
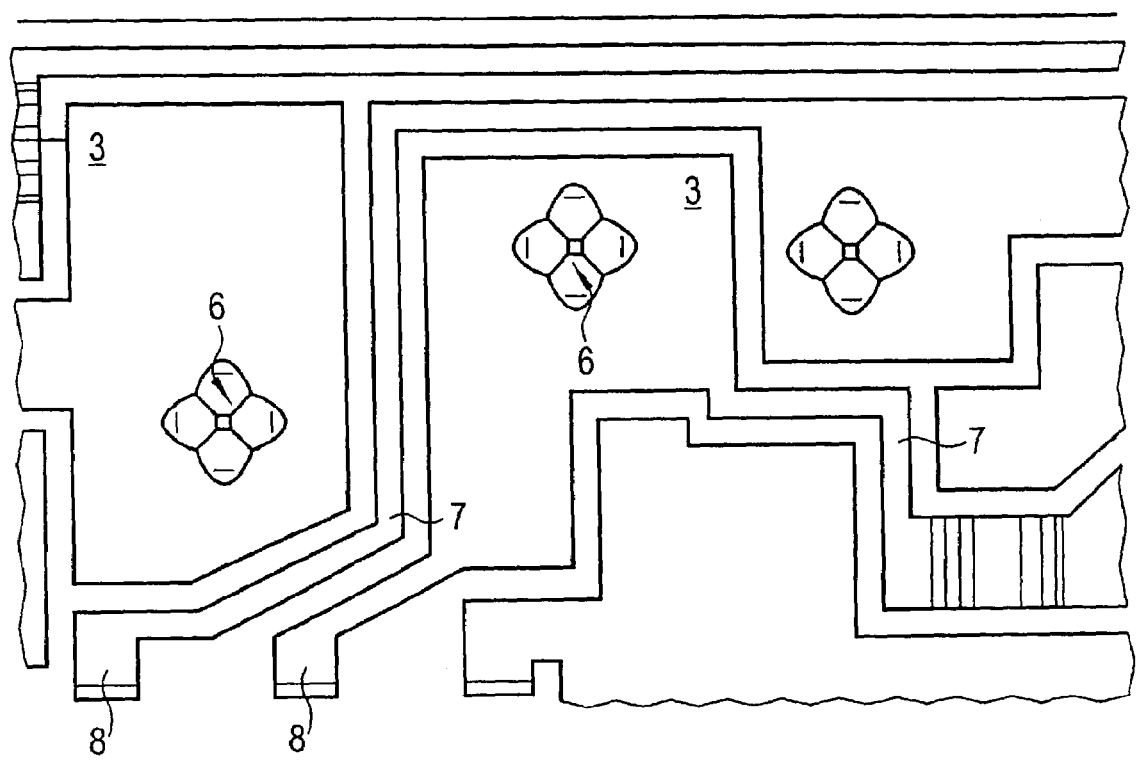
FIG. 2 shows a plan view of a stamped sheet-metal part according to the invention.

FIG. 2 shows a plan view of a stamped sheet-metal part 2 according to the invention. Represented are the regions 3 similar to a protective shield of the stamped sheet-metal part 2 and the self-supporting electrical conductor tracks 7, which are used for the electrical connection of the electronic components 4. Mechanical reinforcements 6 are impressed onto the regions 3 similar to a protective shield of the stamped sheet-metal part 2, in order to allow the compressive stresses during the injection-molding operation to be withstood better. These reinforcements 6 may have the form of a domed roof, a double cross or a cloverleaf. It is also conceivable, however, for mechanical reinforcements 6 to be adhesively bonded, soldered or welded on.

Figure 3:
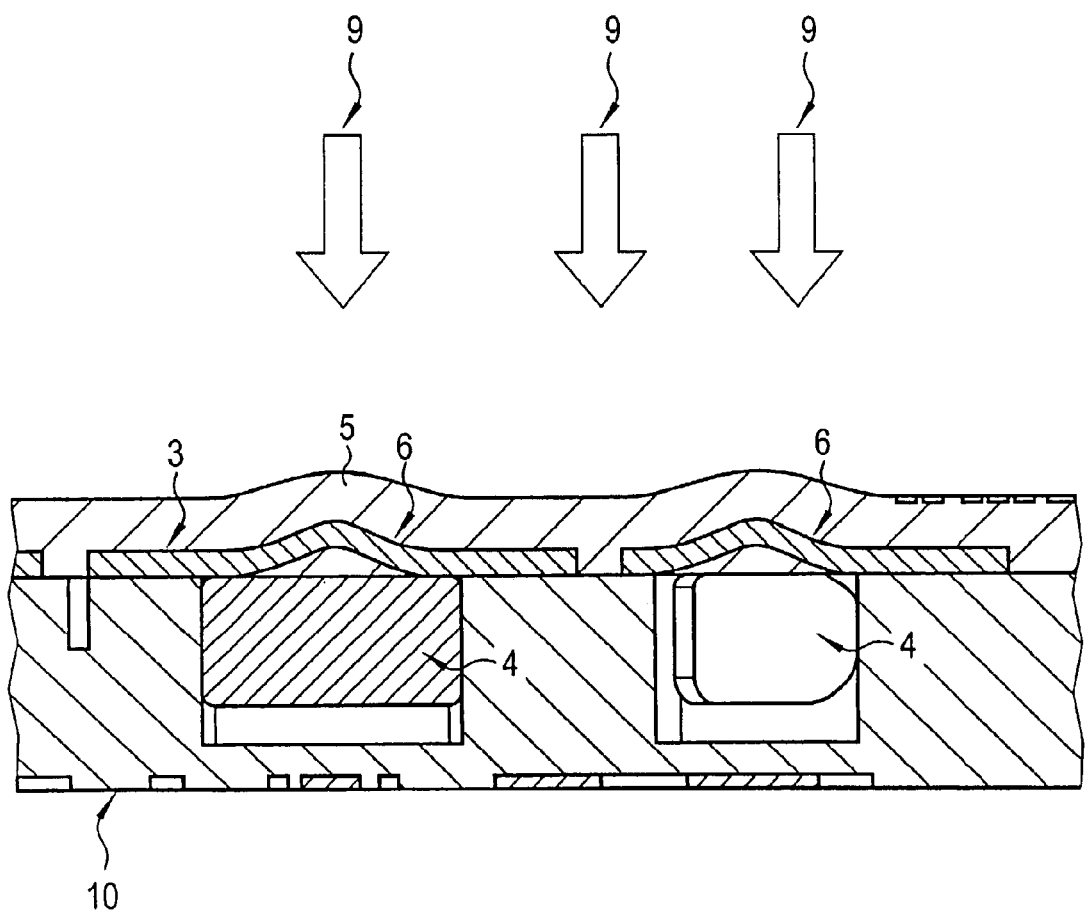
FIG. 3 shows a lateral view of the stamped sheet-metal part according to the invention with the protected electronic components.

Represented in FIG. 3 is a lateral view of the stamped sheet-metal part 2 according to the invention, with the protected electronic components 4 and the lower housing part 10. The regions 3 similar to a protective shield of the stamped sheet-metal part 2, with the dome-like impressed structures 6, can be seen. Arranged under the regions 3 similar to a protective shield of the stamped sheet-metal part 2 are electronic components 4. Indicated above the regions 3 similar to a protective shield of the stamped sheet-metal part 2 is a protective layer, which consists of the molded-on thermoplastic material 5. The direction from which the thermoplastic material 5 transfers the forces induced by the injection pressure onto the stamped sheet-metal part 2 is indicated by the vectors 9. It can be clearly seen that the electronic components 4 are protected by the regions 3 similar to a protective shield of the stamped sheet-metal part 2 from the energy transferred by the molded-on thermoplastic material 5.

Figure 4:
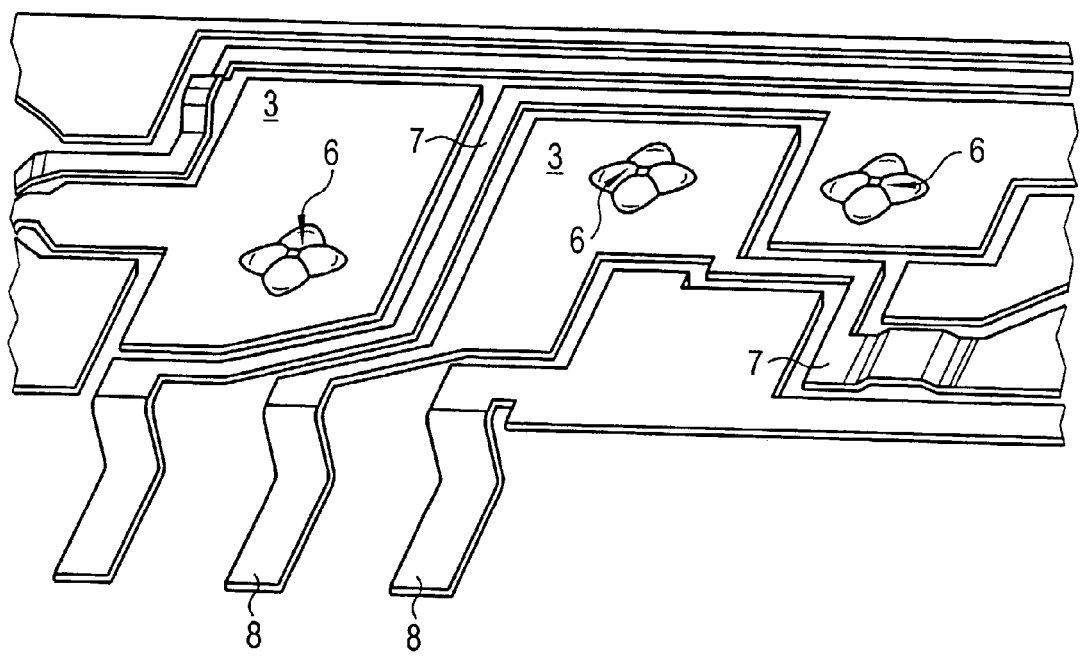
FIG. 4 shows a perspective view of the stamped sheet-metal part according to the invention.

Represented in FIG. 4 is a perspective view of the stamped sheet-metal part 2 according to the invention. The regions 3 similar to a protective shield of the stamped sheet-metal part 2 and the self-supporting electrical conductor tracks 7 are once again shown. The ends of the self-supporting electrical conductor tracks 7 may be formed as plug-in connecting elements 8 with respect to other electronic subassemblies. In this exemplary embodiment, the connecting elements 8 are formed as flat contacts.

Impressed onto the regions 3 similar to a protective shield of the stamped sheet-metal part are cloverleaf-shaped mechanical reinforcements 6, which ensure increased resistance to injection pressure of the regions 3 similar to a protective shield of the stamped sheet-metal part 2.

Figure 5:
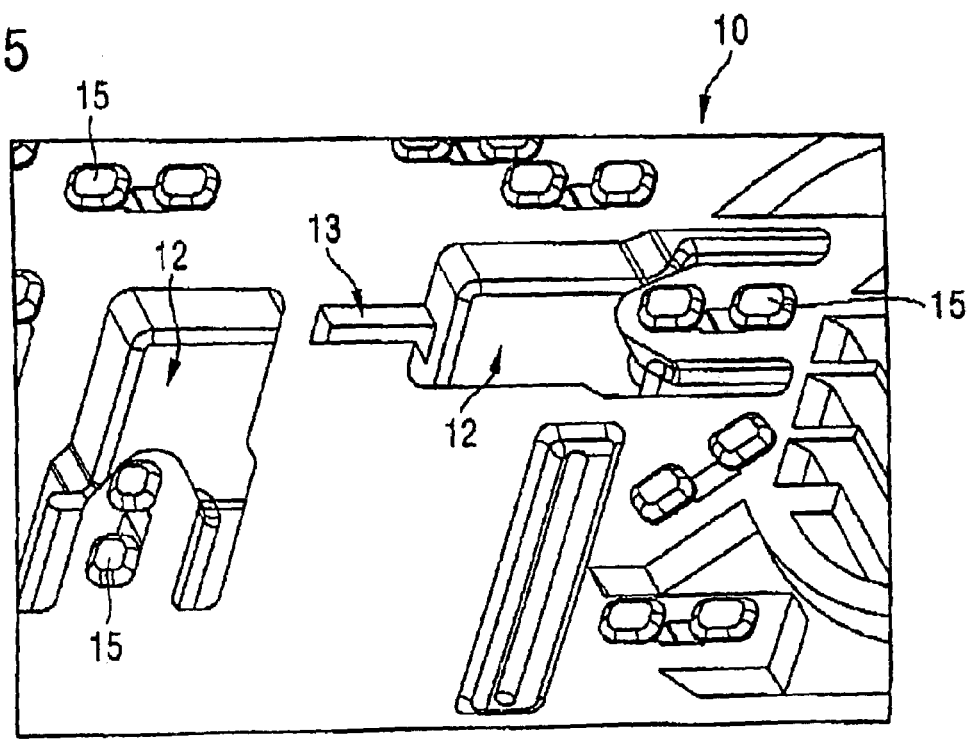
FIG. 5 shows a perspective view of a lower housing part.

FIG. 5 shows a lower housing part 10 with chamber-like formations 12. The chamber-like formations 12 serve as a housing for the electronic components 4 electrically and mechanically connected to the stamped sheet-metal part 2. Leading to the chamber-like formation 12 is a channel 13. The channel 13 permits selective filling of the chamber-like formation 12 with thermoplastic, insulating material 5. Fastening posts 15 provided on the lower housing part 10 serve for fastening the stamped sheet-metal part 2 on the lower housing part 10. A stamped sheet-metal part 2 fastened on the lower housing part 10 is represented in FIG. 6.

Figure 6:
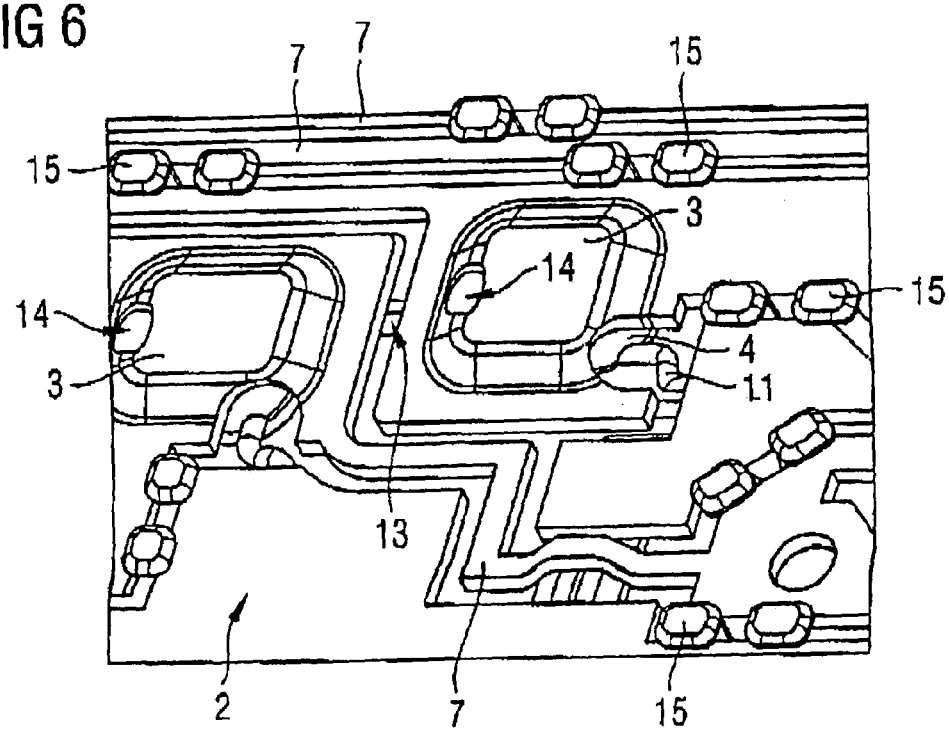
FIG. 6 shows a stamped sheet-metal part mounted on the lower housing part.

In the representation in FIG. 6, the lower housing part 10 is almost completely concealed by the stamped sheet-metal part 2. The fastening posts 15 arranged between the conductor tracks 7 of the stamped sheet-metal part 2 can be seen. The fastening posts 15 bring about a fixed and exact fit of the stamped sheet-metal part 2 on the lower housing part 10.

In this exemplary embodiment, the regions 3 similar to a protective shield of the stamped sheet-metal part 2 have apertures 14. With the aid of these apertures 14, the chamber-like formation 12 can be specifically filled with thermoplastic, insulating material 5. The apertures 14 advantageously interact with the channels 13, so that the electronic components 4 are not directly subjected to the thermoplastic, insulating material 5, but are gently flowed around by it after the kinetic energy and a large part of the thermal energy of the thermoplastic material has been given off.

In this exemplary embodiment, the region 3 similar to a protective shield is shaped in such a way that the terminal conductors 11 bent in an s-shaped manner of the electronic component 4 represented here is not covered by the region 3 similar to a protective shield. Terminal conductors 11 of electronic components 4 are generally less sensitive to mechanical and thermal stresses. Therefore, the terminal conductors 11 can be directly sprayed with the thermoplastic, insulating material 5 without the fear that an electronic component 4 will be damaged. A major advantage of the shaping of the stamped sheet-metal part 2 according to the invention is that sensitive regions of electronic components 4 can be protected very effectively, while other regions of the circuit can be subjected directly to the thermoplastic insulating material 5 without the circuit being damaged.

The invention claimed is:

1. An electronic device comprising electronic components arranged on a mechanically-stable, self-supporting, stamped sheet-metal part and electrically connected to one another by said part, the stamped sheet-metal part and the electronic components being encapsulated in a thermoplastic, insulating material by an injection-molding process, wherein the stamped sheetmetal part (2) has at least one region (3) serving as a shield for protecting an electronic component from heated thermoplastic, insulating material, and the electronic components (4) are arranged downstream of the stamped sheet-metal part (2) in a common direction, which direction is suitable as a direction of injection pressure (9) during an injection-molding process of the heated, thermoplastic, insulating material (5) to enable the shielding from the heated material.

2. The electronic device as claimed in claim 1, wherein at least one mechanical reinforcement (6) is impressed onto said at least one region (3) serving as the protective shield.

3. The electronic device as claimed in claim 2, wherein the mechanical reinforcement (6) has a form of a double cross or a dome or a cloverleaf.

4. The electronic device as claimed in claim 1, wherein a mechanical reinforcement (6) is adhesively bonded, welded or soldered onto said at least one region (3) serving as the protective shield.

5. The electronic device as claimed in claim 4, wherein the mechanical reinforcement (6) has a form of a double cross or a dome or a cloverleaf.

6. The electronic device as claimed in claim 1, wherein the stamped sheet-metal part (2) is connected to the electronic components (4) such that very little thermal energy is transferred to the electronic components (4) from heated stamped sheetmetal part (2).

7. The electronic device as claimed claim 1, wherein the at least one region (3) serving as the protective shield is formed similar to a surface area and said surface area is arranged opposite at least one of said electronic components (4).

8. The electronic device as claimed in claim 1, wherein the stamped sheet-metal part (2) with the regions (3) serving respectively as protective shields and conductor tracks (7) are formed as a self-supporting, metallic structure.

9. The electronic device as claimed in claim 1, wherein the electronic components (4) to be protected are arranged between the stamped sheet-metal part (2) and a lower housing part (10).

10. The electronic device as claimed in claim 9, wherein at least one chamber-like formation (12) is formed in the lower housing part (10).

11. The electronic device as claimed in claim 10, wherein the lower housing part (10) has at least one channel (13), which permits selective filling of the chanter-like formation (12) in the lower housing part (10) with thermoplastic, insulating material (5).

12. The electronic device as claimed in claim 10, wherein respective ones of the regions (3) serving respectively as protective shields have at least one aperture (14), which permits specific filling of the chanter-like formation (12) in the lower housing part (10) and/or of the entire lower housing part (10) with thermoplastic, insulating material.

13. The electronic device as claimed in claim 1, wherein an elastic, vibration-damping material comes at least partly into contact with the electronic components (4) to be protected.

14. The electronic device as claimed in claim 1, wherein terminal conductors (11) of the electronic components (4) are welded, adhesively bonded or soldered to the stamped sheet-metal part (2).

15. The electronic device as claimed in claim 14, wherein the terminal conductors (11) of the electronic components (4) are bent in an S-shaped manner.

16. The electronic device as claimed in claim 14, wherein the terminal conductors (11) of the electronic components (4) are bent in such a way that the electronic components (4) are at a desired angle in relation to the stamped sheet-metal part (2).

17. The electronic device as claimed in claim 1, wherein the stamped sheet-metal part (2) has connecting elements (8) for contacting other electronic devices.

18. The electronic device as claimed in claim 17, wherein the connecting elements (8) are formed as flat contacts.

* * * * *